United States Patent [19]

Loose et al.

[11] Patent Number: 5,747,831
[45] Date of Patent: May 5, 1998

[54] SIC FIELD-EFFECT TRANSISTOR ARRAY WITH RING TYPE TRENCHES AND METHOD OF PRODUCING THEM

[75] Inventors: Werner Loose, Neuhausen; Jacek Korec, Moerfelden-Walldorf; Ekkehard Niemann, Maintal; Alfred Boos, Mainz, all of Germany

[73] Assignee: Daimler-Benz Aktiengesellschaft, Stuttgart, Germany

[21] Appl. No.: 612,906

[22] PCT Filed: Jun. 27, 1995

[86] PCT No.: PCT/EP95/02496

§ 371 Date: Feb. 28, 1996

§ 102(e) Date: Feb. 28, 1996

[87] PCT Pub. No.: WO96/01500

PCT Pub. Date: Jan. 18, 1996

[30] Foreign Application Priority Data

Jul. 1, 1994 [DE] Germany ............... 44 23 068.0

[51] Int. Cl.$^6$ ................................. H01L 31/0312
[52] U.S. Cl. ..................... 257/77; 257/623; 257/334
[58] Field of Search ...................... 257/77, 623, 624, 257/133, 134, 135, 136, 329-334

[56] References Cited

U.S. PATENT DOCUMENTS

| | | | |
|---|---|---|---|
| 4,262,296 | 4/1981 | Shealy et al. ............... | 257/267 |
| 4,941,026 | 7/1990 | Temple ....................... | 257/333 |
| 4,947,218 | 8/1990 | Edmond et al. ............ | 257/77 |
| 5,323,040 | 6/1994 | Baliga ........................ | 257/332 |
| 5,391,895 | 2/1995 | Dreifus ...................... | 257/77 |
| 5,396,085 | 3/1995 | Baliga ........................ | 257/77 |
| 5,506,421 | 4/1996 | Palmour ..................... | 257/77 |

FOREIGN PATENT DOCUMENTS

| | | |
|---|---|---|
| 43 10 345 | 10/1994 | Germany. |
| 1196873 | 8/1989 | Japan ................. 257/77 |

OTHER PUBLICATIONS

Osamu Ozawa et al, "A vertical FET with Self-Alighned Ion-Implantated Source and Gate Regions" (see whole document).

ESSDERC '91: 21st European Solid State Device Research Conference, Montreux, Switzerland, 16-19 Sep. 1991, Microelectronic Engineering, Oct. 1991, Netherlands (see whole document).

*Primary Examiner*—Tom Thomas
*Assistant Examiner*—David B. Hardy
*Attorney, Agent, or Firm*—Spencer & Frank

[57] ABSTRACT

SiC field-effect transistors with source, gate and drain contacts and in which the source contacts are located on the surface of the semiconductor wafer, the drain contacts on the underside of the wafer and the gate contacts in trench-like structures. The trench-like structures surround the source electrodes of the transistors in the shape of a ring and the gate contacts are connected to each other on the floors of the trenches.

22 Claims, 4 Drawing Sheets

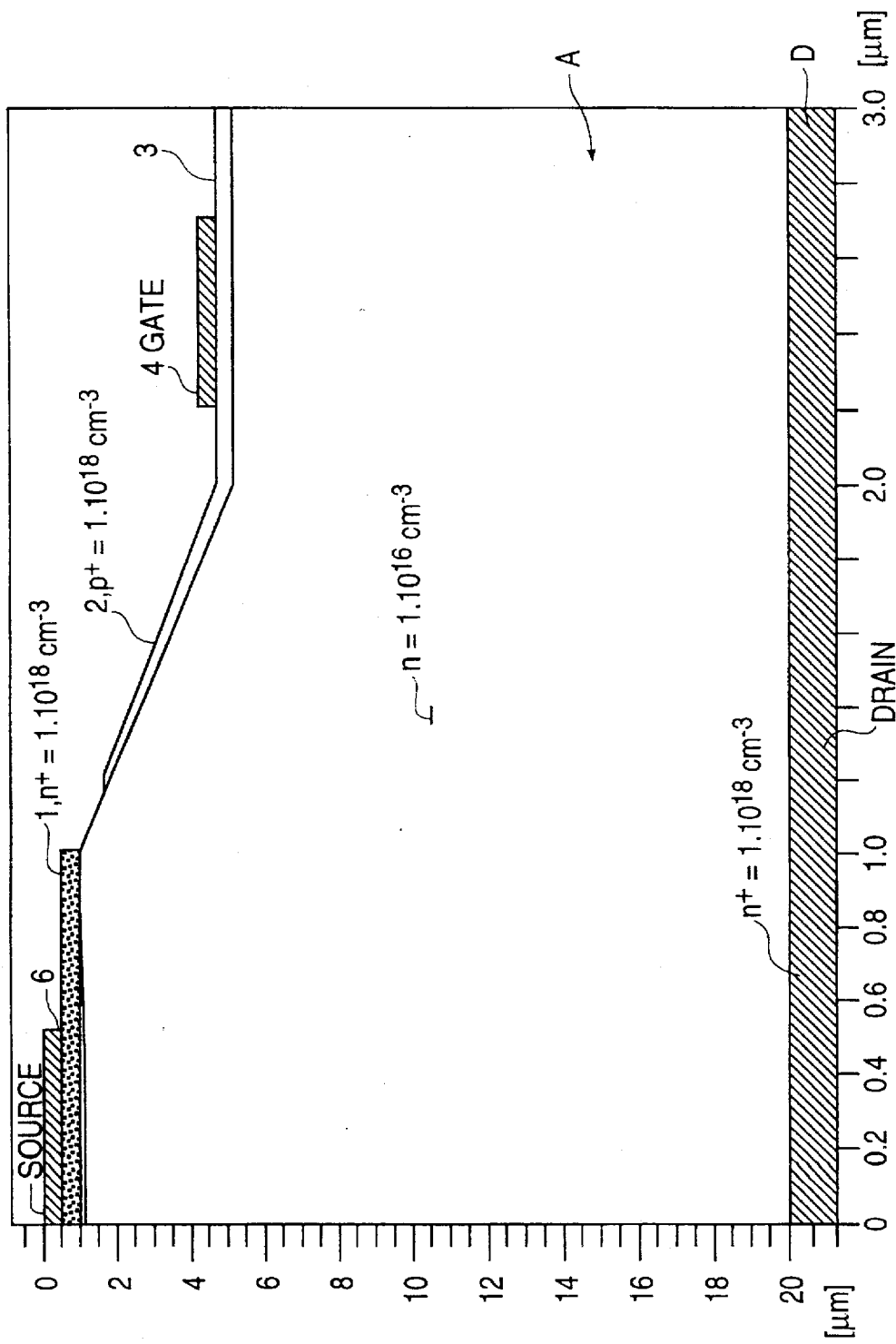

SIC FIELD-EFFECT TRANSISTOR ARRAY WITH RING TYPE TRENCHES AND METHOD OF PRODUCING THEM

BACKGROUND OF THE INVENTION

The invention relates to an arrangement of SiC field-effect transistors and a method of producing them.

Because of its large band gap, SiC has proven suitable for high voltage, and different proposals have been made for embodying field-effect transistors for high voltages.

In silicon technology, it is known to use the "surface-gate technology" described in the book by B. Jayant Baliga, "Modern Power Devices," N.Y., 1987. In order to produce the gate regions of power JFETs, it is not particularly favorable to use the planar technique. Regardless of whether the silicon technique or SiC technique is used, an arrangement of the masks which does not provide precise coverage leads to short circuits if the typical dimensions of the components are used. Nevertheless, in order to maintain the necessarily small dimensions of the components for good blocking ability, it is proposed in the above-cited book to sink the gate. As is readily apparent, this arrangement of the gate contact in a vertical trench, into whose walls boron diffuses, has technological advantages. In particular, the attachment of the gate contact by means of metallization is facilitated by the fact that the metal hardly precipitates on the walls, which saves a separate masking step.

Of course, it is desirable to transfer this technique to SiC material. However, there are various difficulties associated with this.

1. The diffusion of the dopant is not possible, because practically no diffusion occurs in SiC at the conventional processing temperatures.
2. Because a higher field critical intensity is possible in SiC, the structures can be reduced by a factor of 5 to 10. A corresponding lateral scaling approaches the limits of the masking technique. If the geometrical channel width cannot be scaled down accordingly, the pinch-off behavior worsens.

The object of the invention is to provide a structure for field-effect transistors in which a sufficient pinch-off behavior can be achieved in the channel zone by the smallest possible gate voltage.

SUMMARY OF THE INVENTION

The above object generally is achieved according to the present invention by an arrangement of SiC field-effect transistors having a source contact, a gate contact and a drain contact disposed on a semiconductor wafer, wherein the source contacts are disposed on the surface of the semiconductor wafer, the drain contacts are disposed on the underside of the semiconductor wafer, the gate contacts are disposed in trench-shaped structures, with the trench-shaped structures surrounding the individual source electrodes of the field-effect transistors in ring fashion, and with the gate contacts being connected to one another on the bottom of the trenches.

Modifications of the invention and a method of producing the field-effect transistors according to the invention are likewise disclosed.

The essential nature of the invention is that the components no longer have a striated structure, but are configured to be rotationally symmetrical. Because of this, the pinch-off of the channel can be effected from all sides of the annular gate contact on the trench bottom, beginning from the side walls. Because diffusion is not possible, the doping is preferably performed by means of ion implantation. This is particularly simple if the mesa-shaped component has inclined side walls. Because of the inclined side walls, doping is easily possible through ion implantation with boron or other trivalent dopants. The mesa-shaped components are switched in parallel in order to attain greater outputs. The gate contacts are guided in the trenches, the source contacting is effected on the top side of the silicon wafer and the drain connection is attached to the underside.

The invention is described in detail below in conjunction with the drawing.

BRIEF DESCRIPTION OF THE DRAWINGS

FIG. 3 shows a simplified structure of the individual component for simulation calculations.

DETAILED DESCRIPTION OF THE PREFERRED EMBODIMENTS

Figure 1:
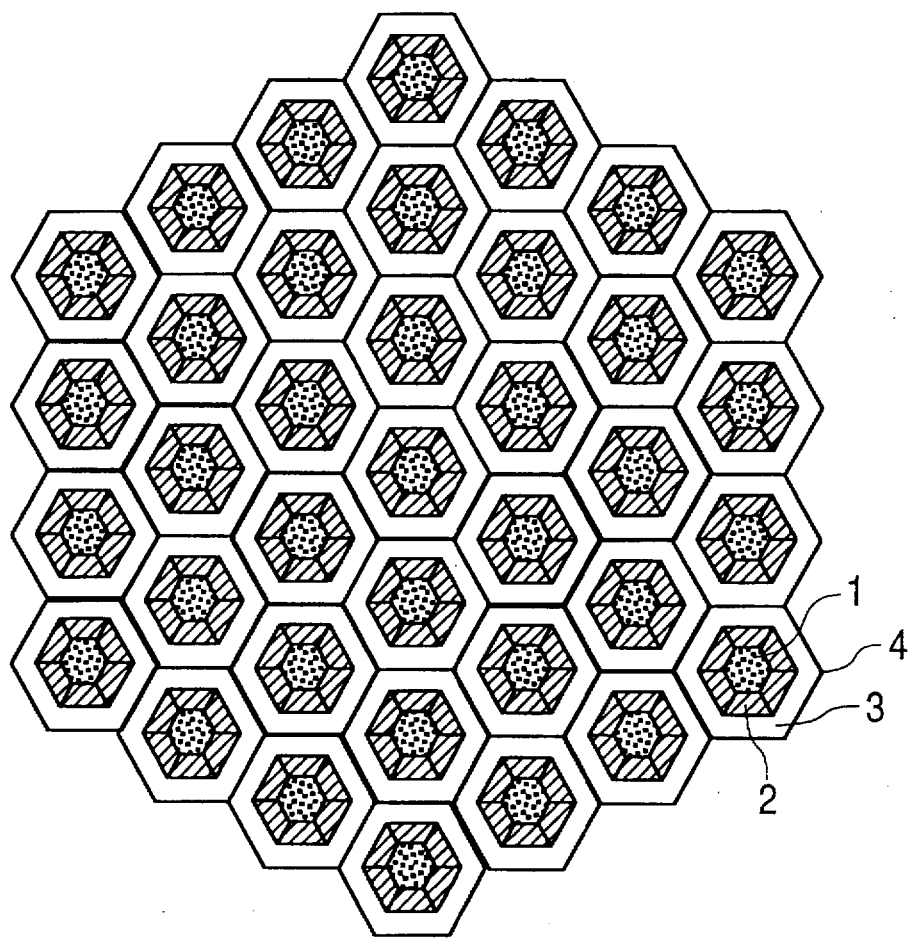
FIG. 1 is a schematic representation of an embodiment of the components in plan view.

In a preferred embodiment of the invention, as shown schematically in a transitional stage in FIG. 1, for example, the individual components are hexagonal and have a diameter of, for example, approximately 6 μm. The source contact 1 is raised, and the side walls 2 of the annular trench are inclined. According to one example, the trenches have side walls 2 which form an angle of 60° to 90° with the horizontal, while according to another example, the side walls 2 of the trenches form an angle of 70° to 85° with the horizontal. The gate contacts 4 on the bottom of the trench 3 surround the individual components and connect them at the same time.

The production of the JFET by means of a self-adjusting masking process is described in detail in conjunction with FIG. 2. This method represents a preferred example. However, the underlying processes can also be easily performed in modified form, for example with an SiC or a silicon wafer being used as substrate D.

The production process is divided into eight individual steps a through h. An Epi layer A made of SiC and having a thickness of approximately 20 μm is deposited on the substrate D with a doping of $10^{16}$ cm$^{-3}$. This substrate preferably comprises a 200–300 μm thick SiC wafer and is doped with a donor of $10^{16}$ cm$^{-3}$. The underside of the SiC layer adjacent thereto is metallized, and forms the drain electrode (not shown). Generally the range of thickness of the layer A between the drain D and source S is 3 to 1000 μm. However, in one embodiment the thickness of the layer A between the drain D and source S is in the range of 3 to 100 μm, while in another example the thickness of the layer A between the drain D and source S is in the range of 3 to 25 μm.

The layer B is an n doped zone which has been deposited in situ or ion-implanted (N=$10^{18}$ cm$^{-3}$).

Figure 2A:
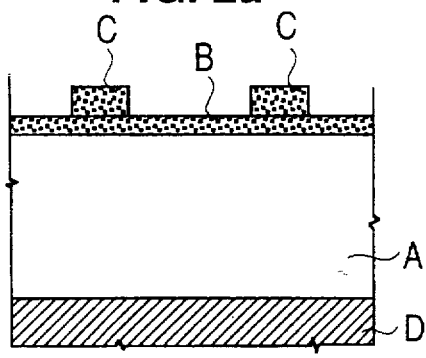
FIGS. 2a–2h schematically illustrate the production method in different phases.
Figure 2B:
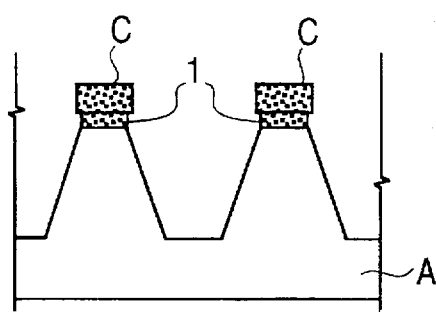
Figure 2C:
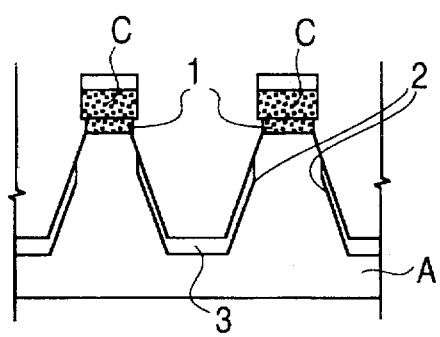
Figure 2D:
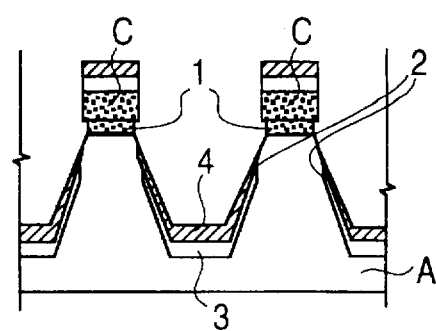

FIG. 2a shows an oxide mask C which is subsequently applied and in this example has a web width of approximately 2 μm, is 1 μm thick and comprises, for example, $SiO_2$. The next step is shown in part b of FIG. 2. First, the $SiO_2$ is structured, which is effected with light underetching of the oxide mask C in accordance with wet-chemical technology. A so-called RIE process of the inclined trenches is effected in the next step by means of a gas mixture. The gas mixture comprises $Cl_2/SiCl_4/O_2/Ar$, or $N_2$ instead of Ar. The concentrations are in the sequence of the enumeration: 40/20/4.2/10 sccm. The depth of the trench in the described and illustrated embodiment is approximately 4 to 5 µm. It is therefore approximately twice as large as the diameter. However, the depth of the trench generally may be in the range of 2 to 10 µm, and more specifically the depth of the trench is in the range of 4 to 8 µm.

Part c of FIG. 2 shows the $p^+$ ion implantation. This implantation is performed with, for example, Al, B or another trivalent element. The depth is approximately 0.5 µm and is attained through multiple implantation with energies E<500 keV. The implantation can be effected from above, i.e., perpendicular to the surface of the silicon wafer, or at an angle and with continuous rotation. In this instance, the doped region 2 is created in the region of the trench wall, and the region 3 is created in the region of the bottom.

The metallization of the gate contacts 4 is shown in part d of FIG. 2. They are produced by sputtering of, for example, Ti, Ni, NiCr or other metallization systems. The production of Schottky contacts is effected simply by not doping the region 2.

Figure 2E:
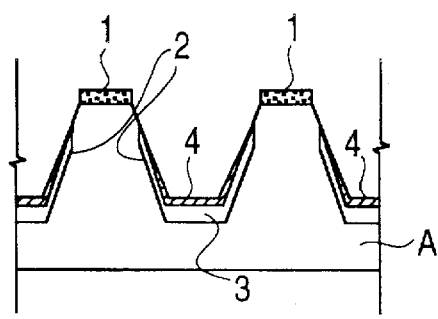
Figure 2F:
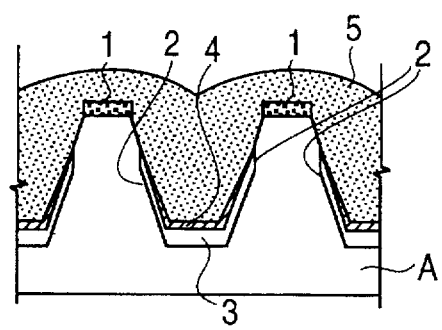

FIG. 2e illustrates the result of the so-called lift-off process. Here the thin metal layer on the trench walls is also etched away, possibly with an additional etching process.

The filling of the trenches with an insulator 5 is shown in the next FIG., 2f. A CVD $SiO_2$ is typically used for this filling process.

Figure 2G:
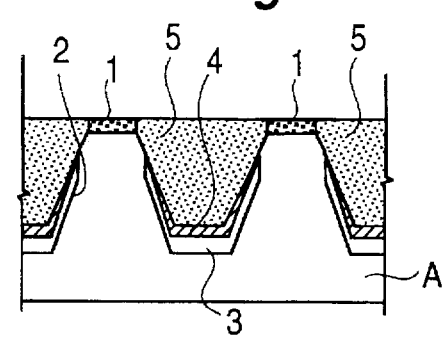
Figure 2H:
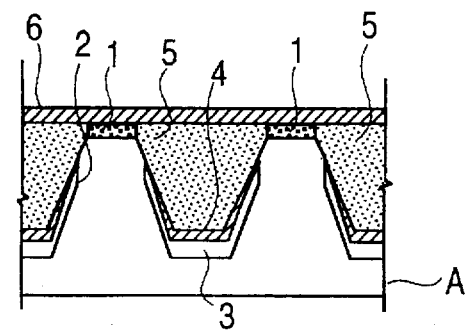

In FIG. 2g the wafer is shown following mechanical polishing of the surface of the oxide 5, with the extreme hardness of the SiC providing a natural polishing stop. An etching process may be inserted as an intermediate step in order to prepare the metallic contacting of the next step. If the oxide layer is relatively level and does not project significantly beyond the layer 1 doped for the contact, a method which solely employs etching and does not include polishing is also possible. This layer 1 comprises islands which are created by structuring the layer B.

As a last step, a total-surface metallic coating is applied in order to produce the source contact 6.

A large-surface parallel connection of the elementary components can be achieved in, for example, a hexagonal structure, as shown in FIG. 1. The gate contacts 4 in the trenches are indicated here in thin lines, and are guided outwardly and on contact paths. The source contacting is effected over the entire surface of the top side of the semiconductor wafers, while the third connection (drain connection) is provided on the underside of the semiconductor wafer.

Figure 4A:
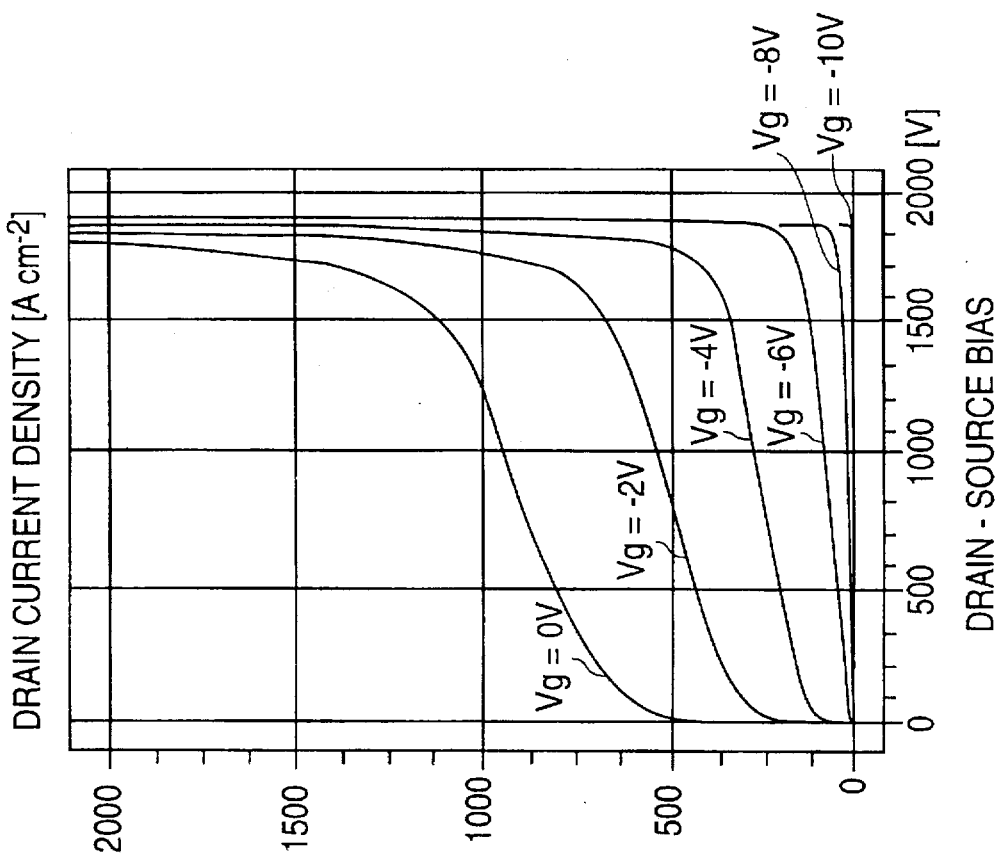
FIGS. 4a and 4b shows the results of simulation calculations for two different geometries.
Figure 4B:
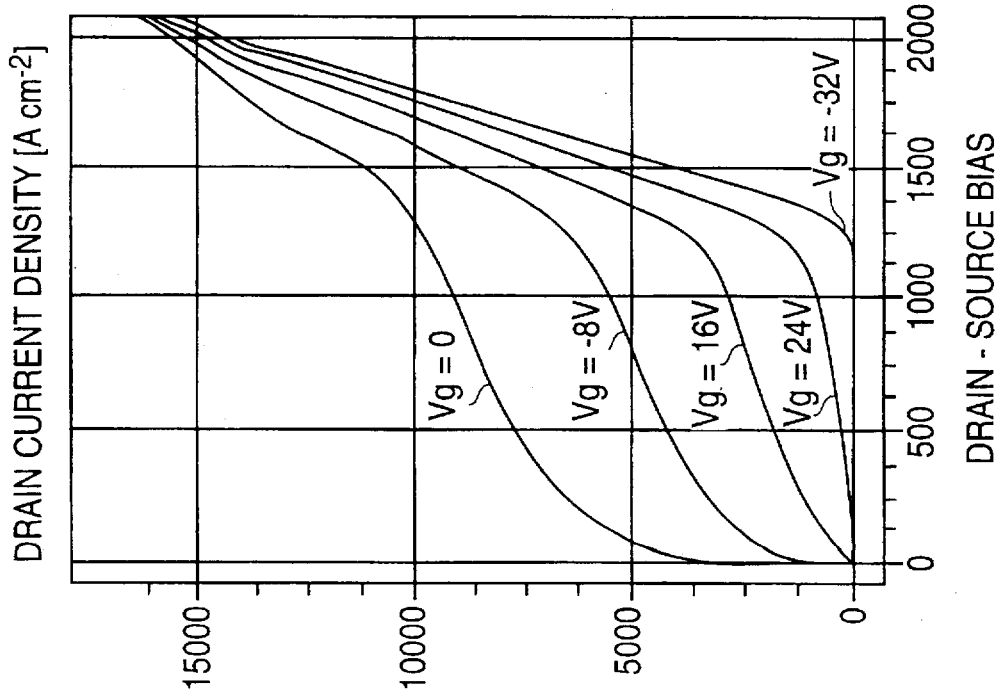

To optimize the different parameters, a computer simulation was performed for a maximum blocking voltage of 2 kV. The electrical characteristic curves of the elementary component shown in FIG. 3 were determined with the aid of a computer simulation. The pinch-off properties, which were improved considerably in a rotationally-symmetrical layout, are shown in FIG. 4. A blocking voltage of 1900 V can be attained in a rotationally-symmetrical structure with a gate voltage of −10 V. As illustrated for striated geometry in the left part of FIG. 4, this does not occur with a gate voltage of −32 V.

For drain voltages $U_D$=3 V, an on-resistance of $R_{on}$=0.013 $\Omega cm^2$, which is therefore smaller by a factor of approximately 100 than in an Si component of identical blocking capability, is read out of the simulations. If maximum power density in a range of 100 to 200 $W/cm^2$ is used as the basis, maximum current densities in a range of 130 to 180 $A/cm^2$ result.

We claim:

1. An arrangement of SiC field-effect transistors, each having a source contact, a gate contact and a drain contact, formed on a semiconductor wafer and wherein: the source contacts are disposed on an upper surface of the semiconductor wafer, the drain contacts are disposed on a flat underside of the semiconductor wafer, the gate contacts are disposed in trenches formed in the semiconductor wafer and extend from the upper surface and which surround respective source electrodes of the field-effect transistors in ring fashion, and the gate contacts are connected to one another on bottom faces of the trenches.

2. An arrangement of SiC field-effect transistors according to claim 1, wherein the trenches have side walls which form an angle of 60° to 90° with the upper surface of the semiconductor wafer.

3. An arrangement of field-effect transistors according to claim 1, wherein the side walls of the trenches form an angle of 70° to 85° with the upper surface of the semiconductor wafer.

4. An arrangement of field-effect transistors according to claim 1, wherein the thickness of a layer extending between drain and source is 3 to 1000 µm.

5. An arrangement of field-effect transistors according to claim 1, wherein the thickness of a layer extending between source and drain is 3 to 25 µm.

6. An arrangement of field-effect transistors according to claim 1, wherein the thickness of a layer extending between source and drain is 3 to 100 µm.

7. An arrangement of field-effect transistors according to claim 1 wherein the depth of the trench is 2 to 10 µm.

8. An arrangement of field-effect transistors according to claim 1, wherein the depth of the trench is 4 to 8 µm.

9. An arrangement of SiC field effect transistors according to claim 1 wherein: the wafer comprises a SiC layer of one conductivity type disposed on a low resistivity substrate and a highly doped source electrode SiC layer of the same conductivity type formed on the SiC layer; the trench is formed in the SiC layer; and the gate electrode is formed directly on at least the bottom faces of the trenches.

10. An arrangement of SiC field effect transistors according to claim 9 wherein the sidewalls and bottom of the trenches are doped to be of the opposite conductivity type from the conductivity type of the SiC layer.

11. Method of producing an arrangement of SiC field-effect transistors having source contacts, drain contacts and gate contacts, wherein the gate regions are disposed in trenches, according to claim 1, wherein: an epitaxial layer of SiC is deposited on a low-resistance substrate on whose underside a drain electrode is disposed, an $n^+$ zone is produced on the surface of this SiC layer, island-shaped regions surrounded by the trenches are etched out of this layer with the aid of a mask, the gate contact is produced by metallization, the mask is removed, the trenches then are filled by an insulator, the contacting of the source electrodes is prepared by at least one of polishing and etching and, finally, the source contact is applied.

12. Method according to claim 11, wherein the side walls and bottom of the trenches are doped by $p^+$ ion implantation prior to producing the gate contact.

13. Method according to claim 12, wherein an implantation with a trivalent element is performed with energies E<2 MeV, wherein the ions impact upon the silicon carbide surface from above.

14. Method according to claim 12, wherein when the ions impact at an angle, the semiconductor wafer rotates so that uniformly-doped regions are created in the region of the trench side walls and trench bottom.

15. Method according to claim 11, wherein the mask is characterized by a structural width of 0.5 to 3 µm.

16. Method according to claim 11, wherein the mask comprises an insulator which is produced from Si, O and/or N.

17. Method according to claim 11, wherein the mask is etched by a wet-chemical etching process and lightly underetched.

18. Method according to claim 11, wherein the trenches are produced using a gas mixture of $Cl_2/SiCl_4/O_2/Ar$, or $N_2$ instead of argon, by means of a so-called RIE process, wherein concentrations of the gases are in the sequence of the enumeration 40/20/4.2/10 sccm.

19. Method according to claim 11, wherein an etching process is performed until the depth of the trench is 2–10 µm and the width is approximately 3–10 µm.

20. Method according to claim 11, wherein a thin metal layer resulting at the trench side walls by metallization of the gate contacts is etched away with an additional etching process.

21. Method according to claim 11, wherein the trenches are filled by CVD $SiO_2$.

22. Method according to claim 11, wherein the mask is structured such that a hexagonal structure of the source contacts and trenches results.

* * * * *